(12) United States Patent
Hung et al.

(10) Patent No.: US 12,046,567 B2
(45) Date of Patent: Jul. 23, 2024

(54) ELECTROSTATIC DISCHARGE CIRCUIT AND METHOD OF FORMING THE SAME

(71) Applicant: Taiwan Semiconductor Manufacturing Company Ltd., Hsinchu (TW)

(72) Inventors: Tao-Yi Hung, Hsinchu (TW); Jam-Wem Lee, Hsinchu (TW); Kuo-Ji Chen, New Taipei (TW); Wun-Jie Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 370 days.

(21) Appl. No.: 17/213,630

(22) Filed: Mar. 26, 2021

(65) Prior Publication Data

US 2021/0366846 A1 Nov. 25, 2021

Related U.S. Application Data

(60) Provisional application No. 63/028,384, filed on May 21, 2020.

(51) Int. Cl.
*H01L 23/62* (2006.01)
*H01L 23/60* (2006.01)
(Continued)

(52) U.S. Cl.
CPC .......... *H01L 23/60* (2013.01); *H01L 27/0248* (2013.01); *H02H 9/046* (2013.01)

(58) Field of Classification Search
CPC . H01L 23/60; H01L 27/2048; H01L 27/0248; H01L 2224/05617;
(Continued)

(56) References Cited

U.S. PATENT DOCUMENTS 10,504,886 B1 * 12/2019 Yam .................. H01L 27/027
2012/0153437 A1 6/2012 Chen et al.
(Continued)

FOREIGN PATENT DOCUMENTS

CN 102362349 A 2/2012
EP 2 412 023 A1 2/2012
(Continued)

OTHER PUBLICATIONS

Office Action issued in connection with Chinese App. No. 202110552260.X dated Apr. 26, 2024.

*Primary Examiner* — Ismail A Muse
(74) *Attorney, Agent, or Firm* — FOLEY & LARDNER LLP

(57) ABSTRACT

A semiconductor device includes a device wafer having a first side and a second side. The first and second sides are opposite to each other. The semiconductor device includes a plurality of first interconnect structures disposed on the first side of the device wafer. The semiconductor device includes a plurality of second interconnect structures disposed on the second side of the device wafer. The plurality of second interconnect structures comprise a first power rail and a second power rail. The semiconductor device includes a carrier wafer disposed over the plurality of first interconnect structures. The semiconductor device includes an electrostatic discharge (ESD) protection circuit formed over a side of the carrier wafer. The ESD protection circuit is operatively coupled to the first and second power rails.

18 Claims, 7 Drawing Sheets

(51) Int. Cl.
*H01L 27/02* (2006.01)
*H02H 9/04* (2006.01)

(58) Field of Classification Search
CPC . H01L 2224/05624; H01L 2224/05647; H01L 2224/05655; H01L 2224/08058; H01L 2224/80379; H01L 23/5286; H01L 25/50; H01L 2224/08145; H01L 2224/80097; H01L 2224/80906; H01L 2224/80948; H01L 2224/94; H01L 2225/06524; H01L 27/0251; H01L 27/0255; H01L 27/0259; H02H 9/04623; H02H 9/60; H02H 9/046
See application file for complete search history.

(56) References Cited

U.S. PATENT DOCUMENTS

| | | |
|---|---|---|
| 2012/0238069 A1 | 9/2012 | Voldman |
| 2014/0268448 A1 | 9/2014 | Tseng et al. |
| 2016/0379936 A1 | 12/2016 | Spitzlsperger et al. |
| 2019/0057950 A1* | 2/2019 | Mueller .......... H01L 24/19 |
| 2019/0214815 A1* | 7/2019 | Fukahori .......... H01L 28/40 |
| 2020/0058646 A1 | 2/2020 | Gomes et al. |

FOREIGN PATENT DOCUMENTS

| | | |
|---|---|---|
| KR | 20090091711 A | 8/2009 |
| KR | 20140112366 A | 9/2014 |
| KR | 20160004356 A | 1/2016 |
| TW | 202002094 A | 1/2020 |
| WO | WO-2008/048412 A1 | 4/2008 |
| WO | WO-2013/057668 A1 | 4/2013 |
| WO | WO-2014/182449 A1 | 11/2014 |

* cited by examiner

ELECTROSTATIC DISCHARGE CIRCUIT AND METHOD OF FORMING THE SAME

CROSS-REFERENCE TO RELATED APPLICATIONS

This application claims the benefit of and priority to U.S. Provisional Patent App. No. 63/028,384, filed May 21, 2020, the entire disclosure of which is incorporated herein by reference.

BACKGROUND

The present disclosure generally relates to semiconductor devices, and particularly to semiconductor devices including electrostatic discharge (ESD) protection circuits.

Integrated circuits are widely used in a variety of applications. The reliability of these integrated circuits may be impacted by a variety of factors. One such factor may be ESD. ESD can cause a short sudden surge of electric charge within the integrated circuit, which can ultimately cause an integrated circuit to fail. Since ESD may occur under a wide range of conditions, such as during fabrication, assembly, testing, field operations, etc., protection from ESD may be critical for the proper operation of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
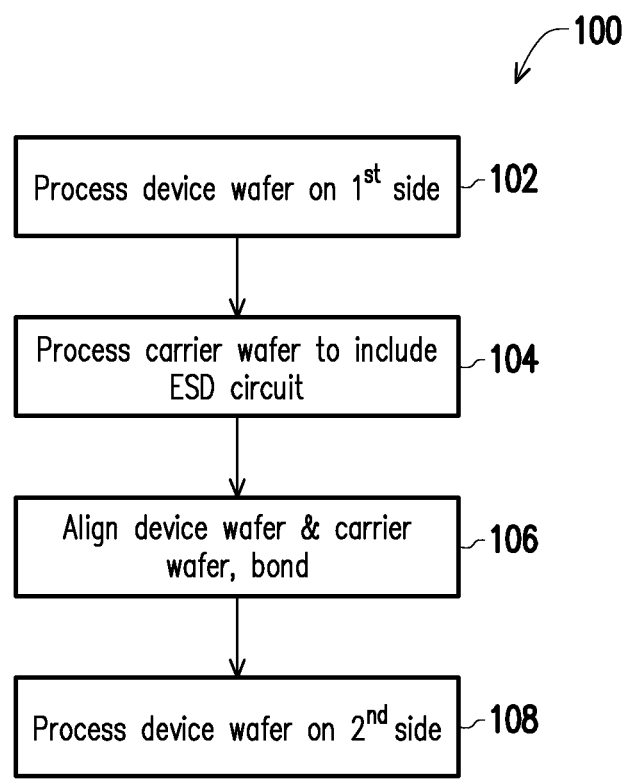
FIG. 1 illustrates a flow chart of an example method for making a semiconductor device that includes an electrostatic discharge (ESD) circuit formed on a carrier wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor manufacturing processes for forming active devices such as metal-oxide-semiconductor FET devices are classified as "front-end-of the-line" (FEOL) or "front-end" and "back-end-of-the-line" (BEOL) or "back-end" processes. Front-end processes typically include doping regions by ion implantation including well implants to form n and p regions in a substrate, shallow trench isolation or LOCOS isolation at device active areas for isolation, forming gate structures including deposition of gate dielectrics and forming gate conductors, forming source and drain regions including ion implantation and thermal diffusion, and forming substrate contacts. Back-end processes typically include forming interconnect structures between the active devices. The interconnect structures are formed as metal conductors in insulating layers, which are sometimes collectively referred to as metallization layers.

In general, the active devices are formed over a device wafer, which is typically required to have a relatively high silicon grade (e.g., prime grade). With the trend of scaling down integrated circuits (ICs), a density of the active devices can be significantly increased. As such, the allocation of real state on the device wafer may become increasingly important, when designing an IC. In this regard, the concept of moving some of the back-end interconnect structures, which are typically disposed on a front side of the device wafer, to its back side has been proposed. For example, the interconnect structures configured to provide power signals (typically known as VDD (high voltage) power rail and VSS (ground) power rail) can be formed on the back side of the device wafer. To achieve this, a carrier wafer, with a relatively low silicon grade (e.g., test grade, dummy grade, reclaimed grade), may be bonded to the device wafer on its front side so as to allow the processing on the back side of the device wafer.

In the existing technologies, such a carrier wafer has only been used to provide a mechanical foundation while processing the back side of the device wafer. However, not all of the active devices are required to be formed on the device wafer, for example, the active devices that are less subjected to the operating speed, the process node (dimensions), etc. As such, the real estate of the device wafer may have been ineffectively used. Thus, the existing technologies to form semiconductor devices are not entirely satisfactory.

The present disclosure provides various embodiments of a semiconductor device that includes a device wafer and a carrier wafer. Over the carrier wafer, the semiconductor device, as disclosed herein, can include one or more devices/structures that may consume a great amount of real estate, if formed on the device wafer. For example, such devices formed on the carrier wafer may function as at least a portion of an electrostatic discharge (ESD) protection circuit. ESD is generally defined as a sudden and momentary electric current that flows between two objects at different electrical potentials (voltages). ESD can damage devices/structures of an IC, causing performance degradation or failures. The ESD protection circuit can dissipate such ESD current transient safely using a discharging channel that prevents thermal damage in the devices/structures of the IC. In some embodiments, the disclosed semiconductor device can include the ESD protection circuit formed on the carrier wafer, instead of the device wafer. The ESD protection circuit can be operatively coupled to power rails that are formed on a back side of the device wafer to protect a number of circuits that are formed on a front side of the device wafer from any ESD. By forming the ESD protection circuit over the carrier wafer, a significant amount of the real estate on the device wafer can be released, which can allow more devices that are more subjected to the operating speed and/or the process node (dimensions) to be formed on the device wafer. While protecting the semiconductor device from ESD, overall performance of the semiconductor device can also be improved.

FIG. 1 illustrates a flowchart of a method 100 to form a semiconductor device, according to one or more embodiments of the present disclosure. For example, at least some of the operations of the method 100 can be used to form a semiconductor device that includes an ESD protection circuit. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of an example semiconductor device at various fabrication stages as shown in FIGS. 2A, 2B, 3A, 3B, 4A, 4B, SA, and SB, respectively, which will be discussed in further detail below.

In brief overview, the method 100 starts with operation 102 of processing a device wafer on its first side. The method 100 continues to operation 104 of processing a carrier wafer to include an ESD circuit. The method 100 continues to operation 106 of aligning the device wafer with the carrier wafer, and then bonding them together. The method 100 continues to operation 108 of processing the device wafer on its second side.

Figure 2A:
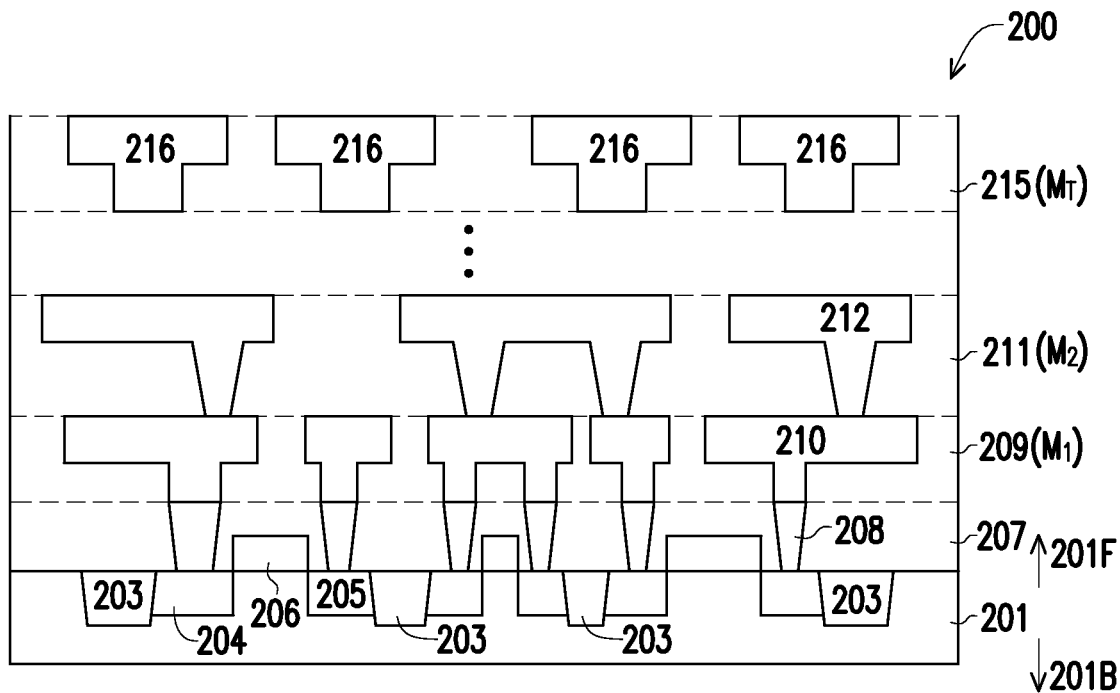
FIGS. 2A, 2B, 3A, 3B, 4A, 4B, 5A, and 5B illustrate cross-sectional views of an example semiconductor device during various fabrication stages, made by the method of FIG. 1, in accordance with some embodiments.
Figure 2B:
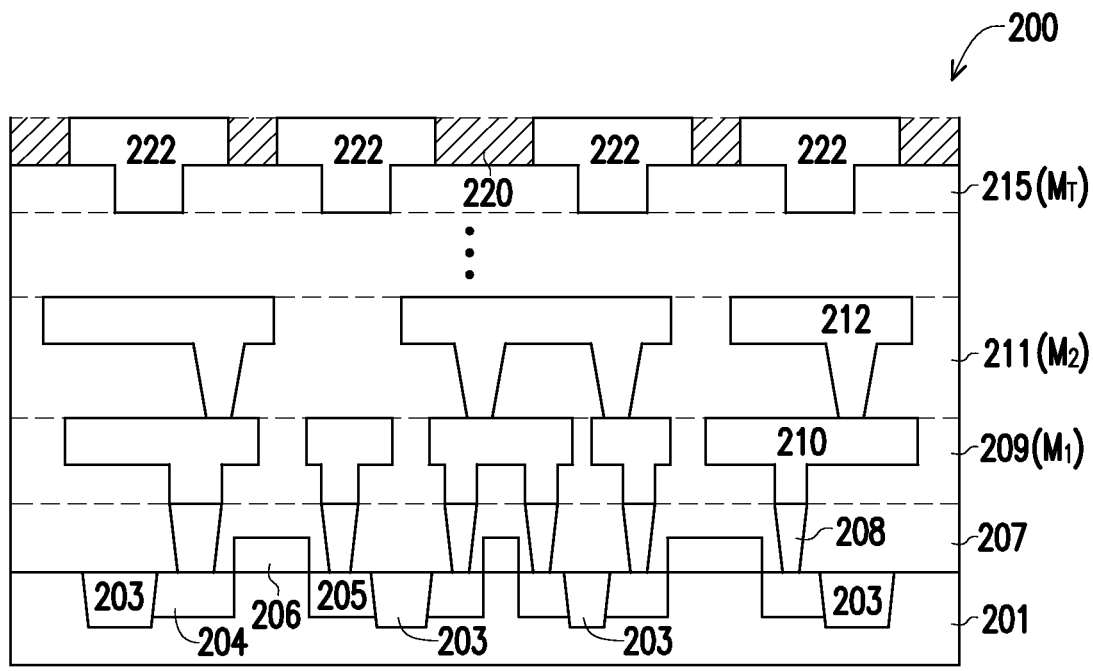

Corresponding to operation 102 of FIG. 1, FIG. 2A and 2B are each a cross-sectional view of a portion the semiconductor device 200 that includes various devices and structures formed on the first side of a device wafer 201 at one of the various stages of fabrication. As shown, the device wafer 201 includes a first side 201F and a second side 201B. The first side 201F and second side 201B are opposite to each other. The first side 201F is sometimes referred to as a front side of the device wafer 201, and the second side 201B is sometimes referred to as a back side of the device wafer 201.

The device wafer 201 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the device wafer 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In various embodiments, the device wafer 201 may be a silicon wafer that has a relatively high grade, e.g., prime grade.

Over the front side 201F of the device wafer 201, a front-end portion of the semiconductor device 200 is formed. The front-end portion can include a number of active devices such as, for example, metal-oxide-semiconductor (MOS) FET transistors that form complementary MOS (CMOS) devices. In CMOS, n-type transistors and p-type transistors are formed on a single substrate (e.g., the device wafer 201) using, for example, oppositely doped well regions separated by isolation regions. As a non-limiting example, CMOS inverters are formed with a common gate structure extending over an N-well and a P-well to form a PMOS and NMOS transistor coupled together as a CMOS inverter, the CMOS inverter is a commonly used circuit element. It should be understood that the active devices, formed on the front side 201F, may include FinFET devices and gate-all-around (GAA) transistors, memory cells, image sensors, and the like, while remaining within the scope of the present disclosure.

For example in FIGS. 2A-B, the front-end portion of the semiconductor device 200 includes an active area which includes isolation regions 203, which may be shallow trench isolation (STI) regions, source regions 204, drain regions 205, which are doped regions in the device wafer 201, and gate regions 206 which include polysilicon or metal gate conductors formed over a gate dielectric region. Over the front side 201F, the semiconductor device 200 includes a layer 207 (sometimes referred to as a "middle-end-of theline" (MEOL) or "middle-end" layer), which includes interconnect structures (e.g., vias, substrate contacts) 208 that form vertical and/or horizontal conductive connections between the front-end portion of the semiconductor device 200 and a back-end portion of the semiconductor device 200.

The back-end portion of the semiconductor device 200 can include two, three, four or many more metallization layers disposed on top of one another. Each of the metallization layers can include a number of interconnect structures formed of a metal, and the interconnect structures are separated and isolated from one another electrically by an intermetal dielectric layer or an interlevel dielectric layer. The metal may include copper (Cu), aluminum (Al), aluminum copper (AlCu), nickel (Ni), aluminum germanium (AlGe), and alloys of these metals. In one embodiment, copper metal interconnect structures are used. The intermetal/interlevel dielectric layer may include oxides such as $SiO_2$, nitrides such as SiN, silicon oxynitride (SiON), high-k dielectrics used in semiconductor devices, and low-k dielectric materials used in semiconductor devices.

The interconnect structures in the metallization layers can be formed by dual and single damascene processes. In damascene, dielectric layers are patterned to form trenches. Conductive (e.g., metals) material is formed by electroplating or electroless plating to fill and overfill the trenches. Chemical mechanical polishing (CMP) is used with or without etching to expose the top surface of the conductive material in the trenches, forming conductive lines. Additional layers are formed by depositing intermetal dielectric material and forming subsequent metal layers.

For example in FIGS. 2A-B, the back-end portion of the semiconductor device 200 includes a metallization layer 209, which includes a number of interconnect structures 210. The metallization layer 209, which is the bottommost metallization layer, is sometimes referred to as an "M1" layer. Over the M1 layer 209, a number of metallization layers, each of which includes a number of interconnect structures, can be formed. In the illustrated embodiment of FIGS. 2A-B, a metallization layer 211 (sometimes referred to as an "M2" layer) that includes a number of interconnect structures 212 is formed over the M1 layer 209. Over the M2 layer, the semiconductor device 200 can further include any number of metallization layers until a topmost metallization layer 215 is formed. The topmost metallization layer 215 is sometimes referred to as an "MT" layer.

Specifically in 2A, the MT layer 215 can include a number of exposed interconnect structures 216 (e.g., pads). The pads 216 may be used to bond the device wafer 201 to one or more other wafers, which will be discussed in further detail below. FIG. 2B illustrates another embodiment of the MT layer 215, which may include a redistribution layer. Such a redistribution layer is formed using insulator or dielectric layer 220 and a metal pattern 222. The dielectric layer 220 may be a dielectric material such as silicon nitride, in one embodiment. Other materials may be used that are compatible with fusion bonding. The redistribution layer may perform a "mapping" function and change the connection pattern of the devices in the underlying layer.

A material of the metal patterns 222 is chosen from copper (Cu), aluminum (Al), aluminum copper (AlCu), nickel (Ni), aluminum germanium (AlGe), and alloys of these metals. The metal patterns 222 are formed as damascene structures in a dielectric material of the dielectric layer 220. The dielectric material in various embodiments is chosen from oxides such as $SiO_2$, nitrides such as SiN, silicon oxynitride (SiON), high-k dielectrics used in semiconductor devices, carbon containing dielectrics such as SiOC, and low-k dielectric materials used in semiconductor devices.

Figure 3A:
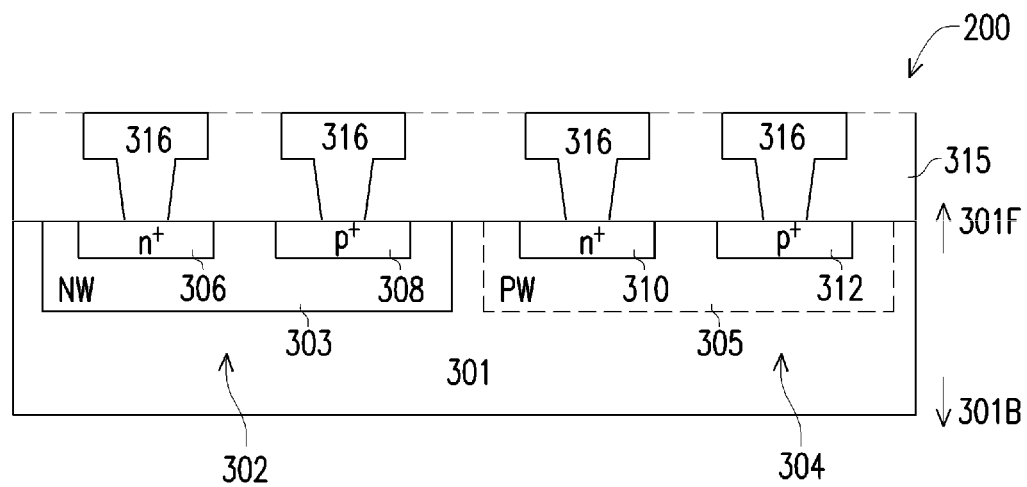
Figure 3B:
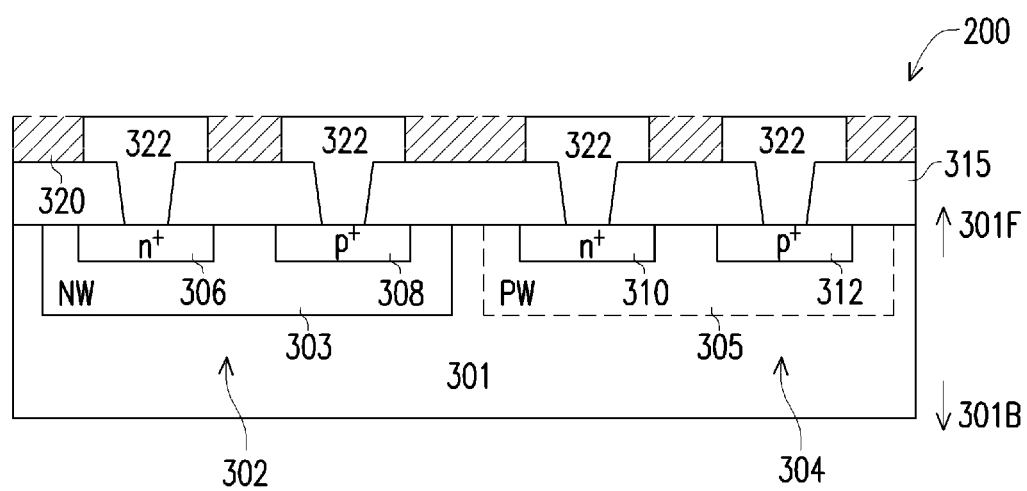

Corresponding to operation 104 of FIG. 1, FIGS. 3A and 3B are each a cross-sectional view of a portion the semiconductor device 200 that includes various devices and structures formed on the first side of a carrier wafer 301 at one of the various stages of fabrication. As shown, the carrier wafer 301 includes a first side 301F and a second side 301B. The first side 301F and second side 301B are opposite to each other. The first side 301F is sometimes referred to as a front side of the carrier wafer 301, and the second side 301B is sometimes referred to as a back side of the carrier wafer 301.

The carrier wafer 301 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the carrier wafer 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In various embodiments, the carrier wafer 301 may be a silicon wafer that has a relatively low grade, e.g., test grade, dummy grade, reclaimed grade.

In various embodiments, at least a portion of an ESD protection circuit is formed over the front side 301F of the carrier wafer 301, which can include one or more devices. For example, such devices functioning as an ESD protection circuit (hereinafter "ESD devices") can include, but are not limited to, diode based devices, RC based devices, transistor based devices, silicon-controller rectifiers, PNP transistors, NPN transistors, NMOS transistors, PMOS transistors, field oxide devices, gate triggered devices, base triggered devices, substrate triggered devices, zener diodes, metal oxide varistors, transient voltage suppression diodes, complementary metal oxide semiconductors (CMOSs), bipolar clamp diodes, and combinations thereof.

As shown in the examples of FIGS. 3A-B, the ESD devices include a first diode 302 and a second diode 304. In some embodiments, the first and second diodes 302 and 304 may be coupled to each other between power rails in series. Although the ESD devices, as disclosed herein, include two diodes in the current example, it should be understood that the ESD devices can include any number of diodes while remaining within the scope of the present disclosure. The diodes 302 and 304 are formed over the front side 301F of the carrier wafer 301, which may be p-type doped. The first diode 302 is formed in a first area of the carrier wafer 301, which may be formed as an N-well 303 extending into the carrier wafer 301; and the second diode 304 is formed in a second area of the carrier wafer 301, which may be optionally formed as a P-well 305 extending into the carrier wafer 301. Specifically, the N-well 303 includes regions 306 and 308 that are heavily n-type (n+) and p-type (p+) doped, respectively; and the P-well 305 includes regions 310 and 312 that are heavily p-type (p+) and n-type (n+) doped, respectively. The n+ region 306 and the p+ region 308 may function as two respective terminals of the diode 302; and the p+ region 310 and the n+ region 312 may function as two respective terminals of the diode 304.

In various embodiments, the n+ region 306 may be electrically coupled to a power rail that conducts or otherwise carries a higher supply voltage (e.g., VDD) and is formed on the back side 201B of the device wafer 201; and the p+ region 310 may be electrically coupled to a power rail that conducts or otherwise carries a lower supply voltage (e.g., VSS) and is formed on the back side 201B of the device wafer 201. The p+ region 308 and the n+ region 312 may be electrically coupled to one or more circuits (sometimes referred to as internal circuits, or input/output circuits) that are formed on the front side 201F of the device wafer 201. The internal circuit, which may be formed by some of the gate regions 206, source regions 204, and drain regions 205, can include, for example, static random access memory (SRAM) array, an embedded SRAM array, dynamic random access memory (DRAM) array, an embedded DRAM array, a field-programmable gate array, a non-volatile memory, e.g., FLASH, EPROM, E2PROME, a logic circuit, an analog circuit, any other kind of integrated circuits, and/or any combinations thereof. In various embodiments, VDD can be 1.5 V, 1.8 V, 2.5 V, 3.3 V, 5 V, 9 V, 12 V, or any other voltage that is desired for operations of the internal circuits, and VSS can be a ground provided by a ground terminal coupled with the internal circuit.

Although in the illustrated examples of FIGS. 3A-B, a portion of the ESD circuit (e.g., diodes 302 and 304) is formed over the carrier wafer 301, the remaining portion of the ESD circuit can also be formed over the carrier wafer 301, while remaining within the scope of the present disclosure. For example, the ESD circuit can include a clamp field effect transistor formed over the carrier wafer 301. The clamp FET can be electrically coupled between the power rail carrying VDD and the power rail carrying VSS. Further, the semiconductor device 200 can include a number of other devices, which are less subjected to operating speed, process node (dimensions), etc., formed over the carrier wafer 301. For example, the semiconductor device 200 can include a number of passive devices and active devices with larger process nodes formed over the carrier wafer 301 (when compared to the devices formed on the front side 201F of the device wafer 201). Example passive devices can include resistors, capacitors, inductors, etc. Example active devices with larger process nodes can include bipolar junction transistors (BJTs), fuses, etc.

Over the front side 301F of the carrier wafer 301, the semiconductor device 200 can further include any number of metallization layers that allow the devices formed on the carrier wafer 301 (e.g., diodes 302-304) to be electrically connected to other devices/structures of the semiconductor device 200. As shown in FIGS. 3A-B, a metallization layer 315, which includes a number of interconnect structures, is formed over the carrier wafer 301. Although one metallization layer is shown in the illustrated embodiments of FIGS. 3A-B, it should be understood that the semiconductor device 200 can include any number of metallization layers, each of which can be similar to the metallization layer 315, formed over the front side 301F of the carrier wafer 301.

Specifically in FIG. 3A, the metallization layer 315 can include a number of exposed interconnect structures 316 (e.g., pads). The pads 316 may be used to bond the carrier wafer 301 to one or more other wafers, which will be discussed in further detail below. FIG. 3B illustrates another embodiment of the metallization layer 315, which may include a redistribution layer. Such a redistribution layer is formed using insulator or dielectric layer 320 and a metal pattern 322. The dielectric layer 320 may be a dielectric material such as silicon nitride, in one embodiment. Other materials may be used that are compatible with fusion bonding. The redistribution layer may perform a "mapping" function and change the connection pattern of the devices in the underlying layer.

A material of the metal patterns 322 is chosen from copper (Cu), aluminum (Al), aluminum copper (AlCu), nickel (Ni), aluminum germanium (AlGe), and alloys of these metals. The metal patterns 322 are formed as damascene structures in a dielectric material of the dielectric layer 320. The dielectric material in various embodiments is chosen from oxides such as $SiO_2$, nitrides such as SiN, silicon oxynitride (SiON), high-k dielectrics used in semiconductor devices, carbon containing dielectrics such as SiOC, and low-k dielectric materials used in semiconductor devices.

Figure 4A:
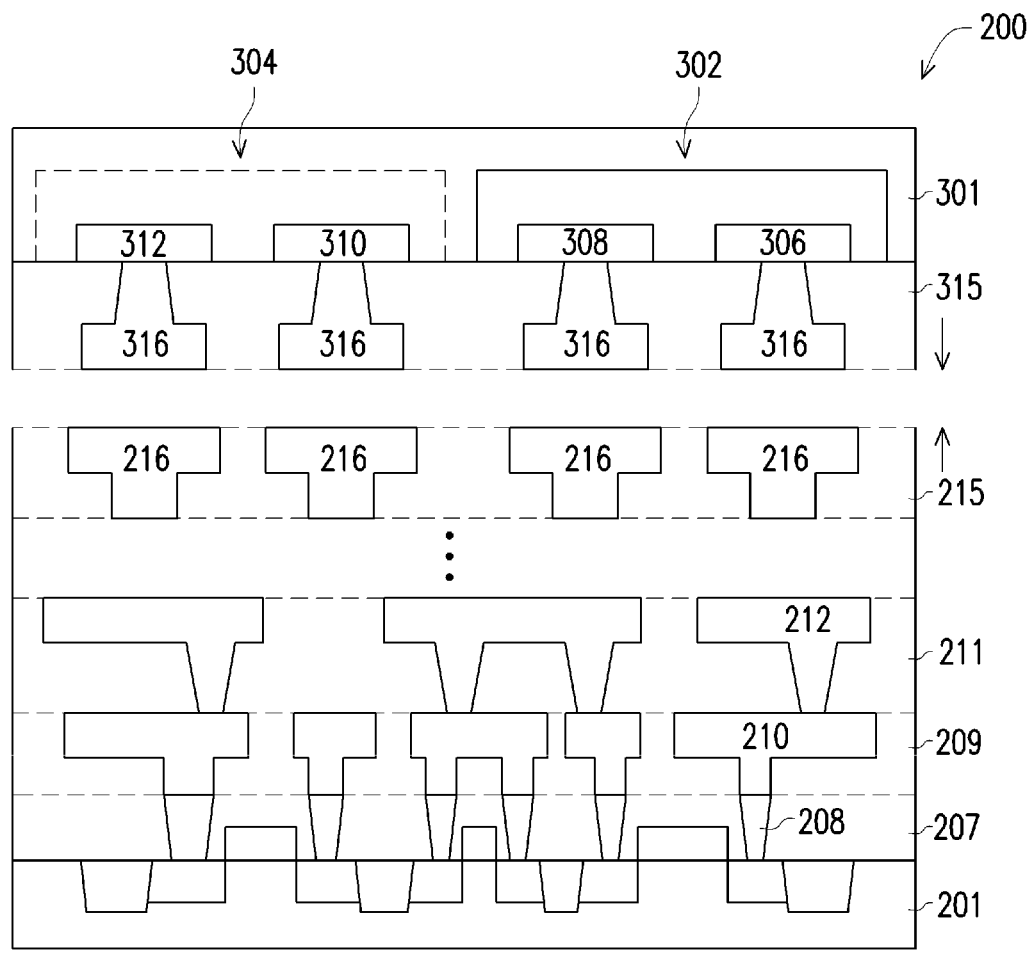
Figure 4B:
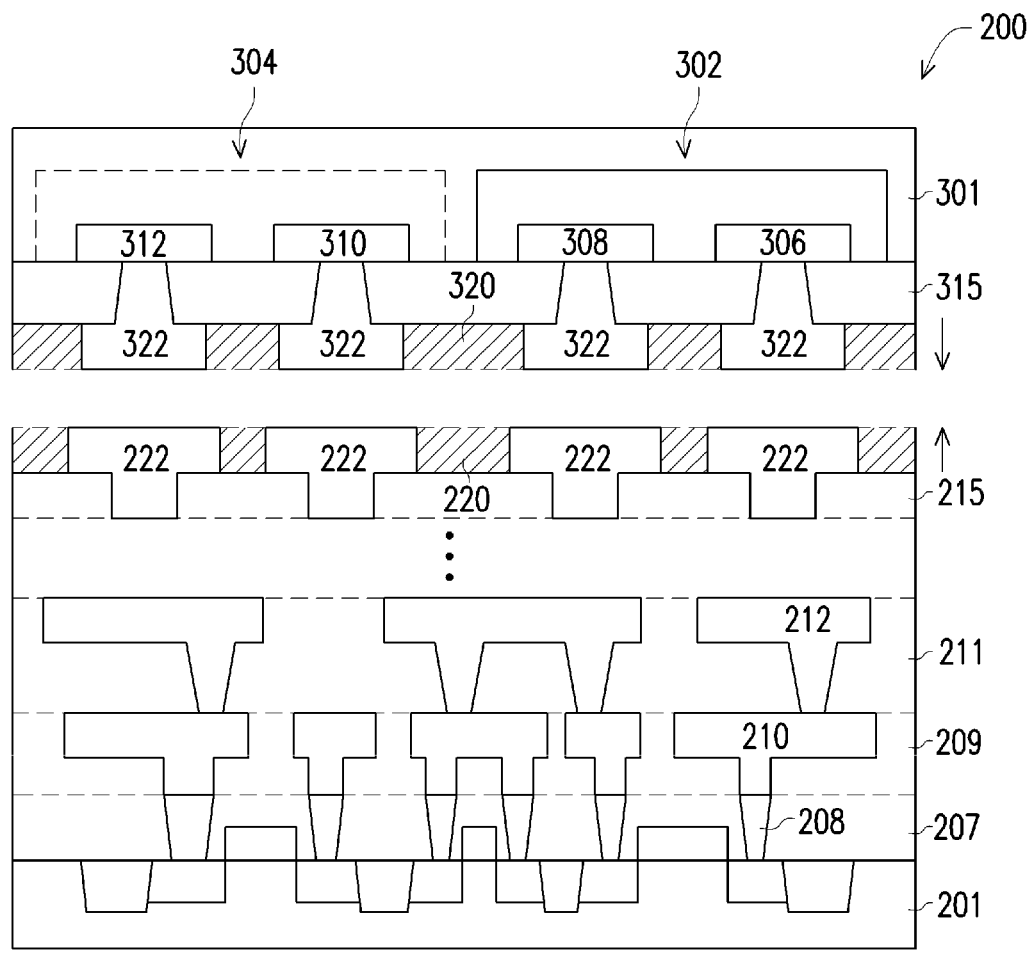

Corresponding to operation 106 of FIG. 1, FIGS. 4A and 4B are each a cross-sectional view of the semiconductor device 200 in which the device wafer 201 and the carrier wafer 301 are bonded together at one of the various stages of fabrication.

Referring first to FIG. 4A, the carrier wafer 301 (with the devices/structures formed thereon) illustrated in FIG. 3A is arranged front side down and aligned with the front side of the device wafer 201 (with the devices/structures formed thereon) illustrated in FIG. 2A. After the alignment, the wafers 201 and 301 are brought into physical contact. In some embodiments, respective top surfaces of the layers 215 and 315 have been prepared to be smooth so that the dielectrics (e.g., interlayer/intermetal dielectrics) of the layers 215 and 315 can form fusion bonds. An anneal process is then performed to convert the interconnect structures 216 and 316 to metal bonds between the wafers 201 and 301. In some other embodiments, prior to the bonding, both the wafers 201 and 301 are subjected to an oxidation step to form metal oxides on the interconnect structures 216/316 at the bonding surface for each of the wafers 201 and 301, in which the metal oxides are subjected to a wet etch to form uniform surfaces on the metal portions. The wafers 201 and 301 are placed into contact, and then a thermal anneal of between about 100 and about 400 degrees C. (° C.) is performed to convert the interconnect structures 216 and 316 to metal bonds, as well as dielectric or oxide-oxide bonds. As discussed above, in one embodiment, the interconnect structures 216 and 316 are copper, and the intermetal/interlevel dielectric layers are silicon oxide. Accordingly, the metal oxidation process forms copper oxide, which is etched in a wet etch process.

Referring then to FIG. 4B, the carrier wafer 301 (with the devices/structures formed thereon) illustrated in FIG. 3B is arranged front side down and aligned with the front side of the device wafer 201 (with the devices/structures formed thereon) illustrated in FIG. 2B, in which the layer 215 disposed over the device wafer 201 and the layer 315 disposed over the carrier wafer 301 each includes a redistribution layer. The redistribution layer of this embodiment can provide larger metal areas, increasing the bonding area for the wafer bonding. In some embodiments, respective top surfaces of the layers 215 and 315 have been prepared to be smooth so that the dielectrics (e.g., interlayer/intermetal dielectrics) of the layers 215 and 315 can form fusion bonds. An anneal process is then performed to convert the interconnect structures 216 and 316 to metal bonds between the wafers 201 and 301. In some other embodiments, prior to the bonding, both the wafers 201 and 301 are subjected to an oxidation step to form metal oxides on the interconnect structures 216/316 at the bonding surface for each of the wafers 201 and 301, in which the metal oxides are subjected to a wet etch to form uniform surfaces on the metal portions. The wafers 201 and 301 are placed into contact, and then a thermal anneal of between about 100 and about 400 degrees C. (° C.) is performed to convert the interconnect structures 216 and 316 to metal bonds, as well as dielectric or oxide-oxide bonds. As discussed above, in one embodiment, the interconnect structures 216 and 316 are copper, and the intermetal/interlevel dielectric layers are silicon oxide. Accordingly, the metal oxidation process forms copper oxide, which is etched in a wet etch process.

In the embodiment to form metal oxides (e.g., copper oxides), the copper oxides are formed using $O_2$ plasma. Other oxidation processes can be used. For example, a steam oxidation process such as in situ steam generation (ISSG) can be used. The copper oxide removal is then performed by wet etch processing. In some embodiments, a dilute hydrogen fluoride (DHF) etch is used. In some other embodiments, the wet etch is chosen from etches including DHF at about 2% concentration, hydrogen chloride (HCl), formic acid (HCOOH), and citric acid. A temperature of the etch process may be controlled less than about 250° C.

Figure 5A:
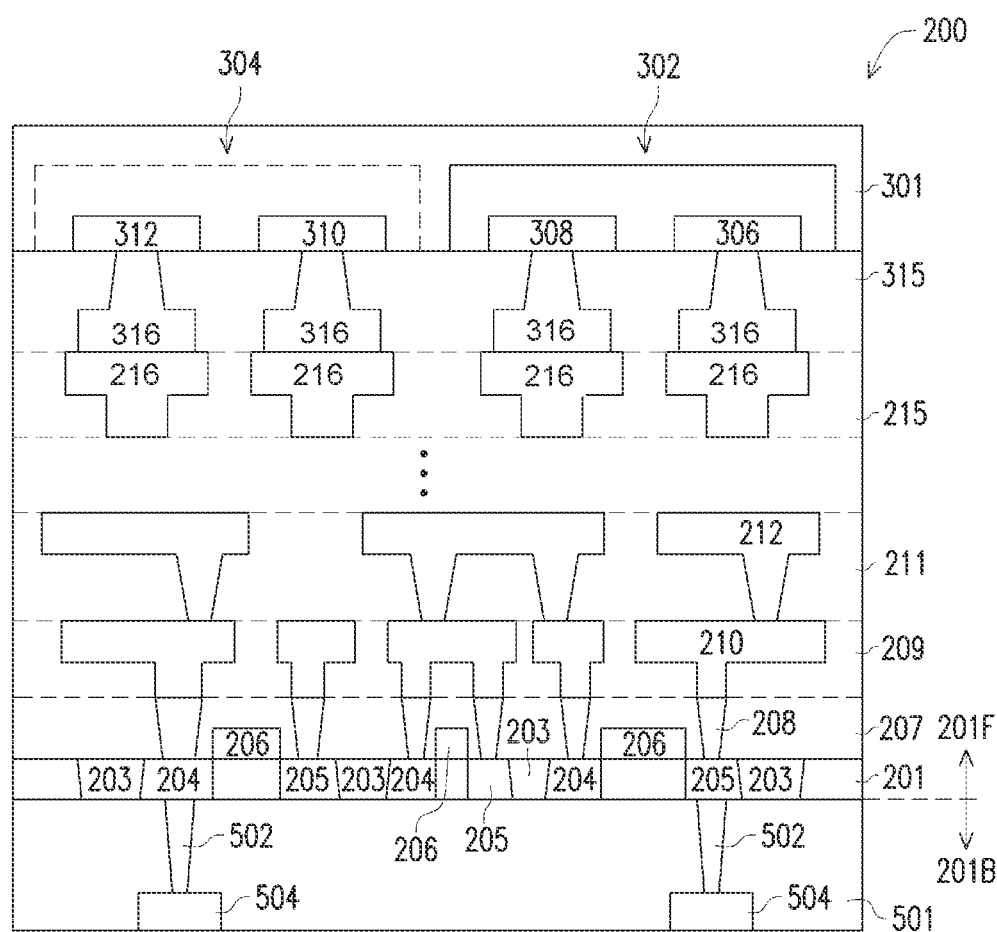
Figure 5B:
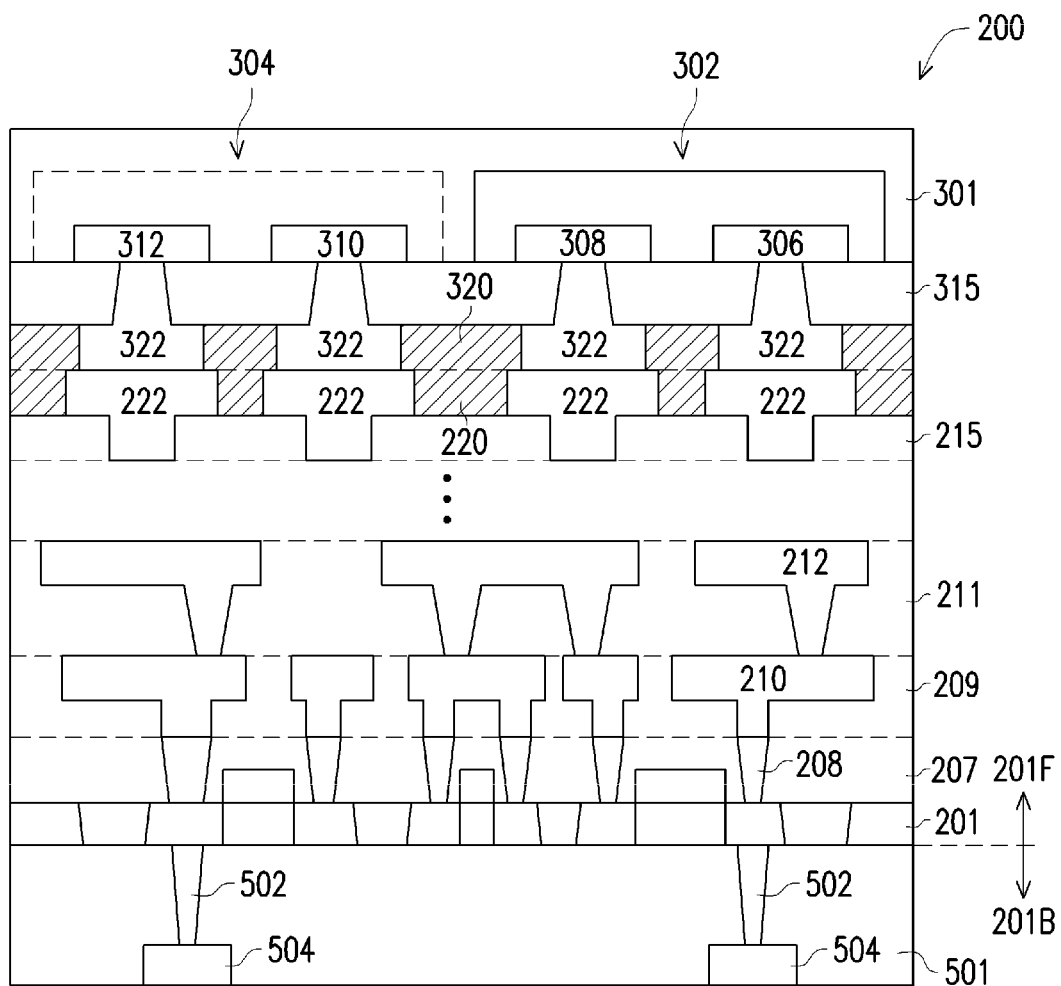

Corresponding to operation 108 of FIG. 1, FIGS. 5A and 5B are each a cross-sectional view of a portion the semiconductor device 200 that includes various structures formed on the back side 201B of the device wafer 201 at one of the various stages of fabrication.

Upon bonding the carrier wafer 301 to the device wafer 201, the device wafer 201 may be polished (e.g., using CMP) from the back side 201B until respective bottom surfaces of the source regions 204 and drain regions 205 are exposed. In some other embodiments, the device wafer 201 may be polished from the back side 201B until respective bottom surfaces of sacrificial layers surrounding the source regions 204 and drain regions 205 are exposed. Such sacrificial layers may be formed prior to the formation of the source/drain regions on the front side 201F of the device wafer 201. Upon the sacrificial layers being exposed, one or more etching processes may be performed to remove those sacrificial layers to expose the source/drain regions.

As such, the device wafer 201 may be thinned down from its backs side 201B. Next, one or more (e.g., metallization) layers 501, each of which includes a number of interconnect structures, are formed over the back side 201B of the device wafer 201. For example in FIGS. 5A-B, the interconnect structures 502 and 504 are formed of a metal, and the interconnect structures are separated and isolated from one another electrically by an intermetal dielectric layer or an interlevel dielectric layer. The metal may include copper (Cu), aluminum (Al), aluminum copper (AlCu), nickel (Ni), aluminum germanium (AlGe), and alloys of these metals. In one embodiment, copper metal interconnect structures are used. The intermetal/interlevel dielectric layer may include oxides such as $SiO_2$, nitrides such as SiN, silicon oxynitride (SiON), high-k dielectrics used in semiconductor devices, and low-k dielectric materials used in semiconductor devices.

In accordance with various embodiments, the interconnect structures 504 can be configured as power rails. For example, one of the interconnect structure 504 may be configured as a high voltage power rail to provide VDD, and another of the interconnect structure 504 may be configured as a low voltage power rail to provide VSS (ground). The n+ terminal/region 306 of the first diode 302 can be electrically coupled to such a VDD power rail, through a number of interconnect structures/regions coupled there between (e.g., 316, 216, 212, 210, 208, 204/205, and 502 of FIG. 5A, 322, 222, 212, 210, 208, 204/205, and 502 of FIG. 5B); and the p+ terminal/region 310 of the second diode 304 can be electrically coupled to such a VSS power rail, through a number of interconnect structures/regions coupled there between (e.g., 316, 216, 212, 10, 208, 204/205, and 502 of FIG. 5A, 322, 222, 212, 210, 208, 204/205, and 502 of FIG. 5B). Similarly, the p+ terminal/region 308 of the first diode 302 and the n+ terminal/region 312 of the second diode 304 can be electrically coupled to the internal circuits (e.g., formed on the front side 201F of the device wafer 201), through a number of interconnect structures coupled there between (e.g., 316, 216, 212, 210, and 208 of FIG. 5A, 322, 222, 212, 210, and 208 of FIG. 5B). Although not shown, it should be appreciated that over the layer 501, the semiconductor device 200 can include a number of interconnect structures for external connections such as, for example, bond wires, solder balls, solder bumps, and the like.

In one aspect of the present disclosure, a semiconductor device is disclosed. The semiconductor device includes a device wafer having a first side and a second side. The first and second sides are opposite to each other. The semiconductor device includes a plurality of first interconnect structures disposed on the first side of the device wafer. The semiconductor device includes a plurality of second interconnect structures disposed on the second side of the device wafer. The plurality of interconnect structures comprise a first power rail and a second power rail. The semiconductor device includes a carrier wafer disposed over the plurality of first interconnect structures. The semiconductor device includes an electrostatic discharge (ESD) protection circuit formed over a side of the carrier wafer. The ESD protection circuit is operatively coupled to the first and second power rails.

In another aspect of the present disclosure, a semiconductor device is disclosed. The semiconductor device includes a first wafer having a first side and a second side that are opposite to each other. The semiconductor device includes a second wafer having a first side and a second side that are opposite to each other. The first side of the first wafer faces the first side of the second wafer. The semiconductor device includes a plurality of first interconnect structures that are disposed between the first side of the first wafer and the first side of the second wafer. The semiconductor device includes a plurality of second interconnect structures that are disposed on the second side of the first wafer. The semiconductor device includes an electrostatic discharge (ESD) protection circuit formed on the first side of the second wafer.

In yet another aspect of the present disclosure, a method for making a semiconductor device is disclosed. The method includes forming a plurality of interconnect structures over a first side of a first wafer. The method includes forming an electrostatic discharge (ESD) protection circuit over a first side of a second wafer. The first wafer has a higher grade than the second wafer. The method includes coupling the first side of the first wafer to the first side of the second wafer. The method includes polishing the first wafer from a second side of the first wafer. The second side of the first wafer is opposite to the first side of the first wafer. The method includes forming a first power rail and a second power rail over the second side of the first wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a device wafer having a first side and a second side, wherein the first and second sides are opposite to each other;
    a plurality of first interconnect structures disposed on the first side of the device wafer;
    a plurality of second interconnect structures disposed on the second side of the device wafer, wherein the plurality of second interconnect structures comprise a first power rail and a second power rail having opposite potentials; and
    a carrier wafer disposed over the plurality of first interconnect structures and including an electrostatic discharge (ESD) protection circuit comprising a first diode and a second diode formed therein;
    wherein the device wafer has a higher grade than the carrier wafer, wherein the ESD protection circuit is formed over a side of the carrier wafer, and wherein the first diode is operatively coupled to the first power rail and the second diode is operatively coupled to the second power rail through at least one or more of the plurality of first interconnect structures.

2. The semiconductor device of claim 1, wherein the first diode has a first terminal connected to the first power rail that is configured to carry VDD, and the second diode has a first terminal connected to the second power rail that is configured to carry VSS.

3. The semiconductor device of claim 2, wherein the first terminal of the first diode is connected to the first power rail through the plurality of first interconnect structures and the first terminal of the second diode is connected to the second power rail through the plurality of first interconnect structures.

4. The semiconductor device of claim 2, wherein the first diode has a second terminal and the second diode has a second terminal, and wherein the respective second terminals of the first and second diodes are connected to one or more devices formed on the first side of the device wafer.

5. The semiconductor device of claim 4, wherein the first terminal of the first diode is formed as a first region over the side of the carrier wafer, the second terminal of the first diode is formed as a second region over the side of the carrier wafer, the first terminal of the second diode is formed as a third region over the side of the carrier wafer, and the second terminal of the second diode is formed as a fourth region over the side of the carrier wafer, and wherein the first and fourth regions are in a first conductive type, and the second and third regions are in a second conductive type, the first conductive type being different from the second conductive type.

6. The semiconductor device of claim 5, wherein the first and second regions are disposed in a well over the side of the carrier wafer, and wherein the well is in the first conductive type and the carrier wafer is in the second conductive type.

7. The semiconductor device of claim 1, wherein the side of the carrier wafer faces the first side of the device wafer.

8. The semiconductor device of claim 1, further comprising a plurality of passive devices formed over the side of the carrier wafer.

9. A semiconductor device, comprising:
a first wafer having a first side and a second side that are opposite to each other;
a second wafer having a first side and a second side that are opposite to each other, wherein the first side of the first wafer faces the first side of the second wafer, wherein the second wafer includes an electrostatic discharge (ESD) protection circuit comprising a first diode and a second diode formed within the second wafer and on the first side of the second wafer, and wherein the first wafer has a higher grade than the second wafer;
a plurality of first interconnect structures that are disposed between the first side of the first wafer and the first side of the second wafer; and
a plurality of second interconnect structures that are disposed on the second side of the first wafer,
wherein the first diode is operatively coupled to a first power rail and the second diode is operatively coupled to a second power rail, the first power rail and the second power rail having opposite potentials.

10. The semiconductor device of claim 9, wherein the plurality of second interconnect structures include a first power rail and a second power rail, the ESD protection circuit electrically connected to the first and second power rails through the plurality of first interconnect structures.

11. The semiconductor device of claim 9, wherein the ESD protection circuit includes a first diode and a second diode connected in series.

12. The semiconductor device of claim 11, wherein the first diode has a first terminal connected to a first one of the plurality of second interconnect structures that is configured to carry VDD, and the second diode has a first terminal connected to a second one of the plurality of second interconnect structures that is configured to carry VSS.

13. The semiconductor device of claim 11, wherein the first diode has a second terminal and the second diode has a second terminal, and wherein the respective second terminals of the first and second diodes are connected to one or more devices formed on the first side of the first wafer.

14. The semiconductor device of claim 9, further comprising a plurality of passive devices formed on the first side of the second wafer.

15. A method for making a semiconductor device, comprising:
forming a plurality of interconnect structures over a first side of a first wafer;
forming an electrostatic discharge (ESD) protection circuit within a second wafer and over a first side of the second wafer, the ESD protection circuit comprising a first diode and a second diode formed therein, wherein the first wafer has a higher grade than the second wafer;
coupling the first side of the first wafer to the first side of the second wafer;
polishing the first wafer from a second side of the first wafer, wherein the second side of the first wafer is opposite to the first side of the first wafer; and
forming a first power rail and a second power rail over the second side of the first wafer,
wherein the first diode is operatively coupled to the first power rail and the second diode is operatively coupled to the second power rail, the first power rail and the second power rail having opposite potentials.

16. The method of claim 15, wherein the first and second power rails are operatively coupled to the ESD protection circuit through the plurality of interconnect structures.

17. The method of claim 15, wherein the first diode has a first terminal connected to the first power rail that is configured to carry VDD, and the second diode has a first terminal connected to the second power rail that is configured to carry VSS.

18. The method of claim 15, wherein the first wafer has a higher grade than the second wafer.

* * * * *